United States Patent
Hasegawa (10) Patent No.: US 11,027,338 B2
(45) Date of Patent: Jun. 8, 2021

(54) CUTTING INSERT, CUTTING TOOL, AND METHOD FOR MANUFACTURING MACHINED PRODUCT

(71) Applicant: KYOCERA Corporation, Kyoto (JP)

(72) Inventor: Mitsuru Hasegawa, Satsumasendai (JP)

(73) Assignee: KYOCERA Corporation, Kyoto (JP)

( * ) Notice: Subject to any disclaimer, the term of this patent is extended or adjusted under 35 U.S.C. 154(b) by 458 days.

(21) Appl. No.: 15/577,278

(22) PCT Filed: Mar. 18, 2016

(86) PCT No.: PCT/JP2016/058785
§ 371 (c)(1),
(2) Date: Nov. 27, 2017

(87) PCT Pub. No.: WO2016/189935
PCT Pub. Date: Dec. 1, 2016

(65) Prior Publication Data
US 2018/0161886 A1  Jun. 14, 2018

(30) Foreign Application Priority Data

May 28, 2015  (JP) .............................. JP2015-108748

(51) Int. Cl.
*B23B 27/14* (2006.01)
*C23C 28/04* (2006.01)
(Continued)

(52) U.S. Cl.
CPC .......... *B23B 27/146* (2013.01); *B23B 27/145* (2013.01); *C23C 14/0641* (2013.01);
(Continued)

(58) Field of Classification Search
CPC ........ B32B 2200/201; B32B 2200/242; B32B 27/146
See application file for complete search history.

(56) References Cited

U.S. PATENT DOCUMENTS 5,709,907 A * 1/1998 Battaglia ............... B23B 27/146
427/126.1
2002/0127068 A1  9/2002 Kinukawa et al.
(Continued)

FOREIGN PATENT DOCUMENTS

JP  H08-155702 A  6/1996
JP  H10-043912 A  2/1998
(Continued)

OTHER PUBLICATIONS

English translation of JP2008142890 from EPO Sep. 2020 (5 pages) (Year: 2020).*
(Continued)

*Primary Examiner* — Adam Krupicka
(74) *Attorney, Agent, or Firm* — Viering, Jentschura & Partner MBB (57) ABSTRACT

In an embodiment, a cutting insert including a base member, a first face, a second face, a cutting edge, and a nose portion. The base member includes a coating layer on at least a part thereof. The first face has corner portions. The second face is adjacent to the first face. The cutting edge is on at least a part of the ridgeline portion of the first face and the second face, and includes first and second cutting edges. The first cutting edge is on the coating layer and has a C chamfered surface with a first width of 5 μm to 30 μm in the front view of the first face and a chamfer angle of 35° to 50°. The nose portion is at the corner portions between the first cutting edge and the second cutting edge.

18 Claims, 7 Drawing Sheets

(51) Int. Cl.
*C23C 14/06* (2006.01)
*C23C 14/08* (2006.01)
*C23C 30/00* (2006.01)

(52) U.S. Cl.
CPC ........ *C23C 14/0664* (2013.01); *C23C 14/081* (2013.01); *C23C 28/044* (2013.01); *C23C 30/005* (2013.01); *B23B 2200/201* (2013.01); *B23B 2200/242* (2013.01); *B23B 2200/28* (2013.01); *B23B 2200/3609* (2013.01); *B23B 2200/3672* (2013.01); *B23B 2226/125* (2013.01); *B23B 2228/10* (2013.01)

(56) References Cited

U.S. PATENT DOCUMENTS

2006/0228179 A1* 10/2006 Alm ................. B23B 27/145
  407/113
2013/0022420 A1   1/2013 Waki et al.
2013/0152480 A1*  6/2013 Eyre ................. C22C 26/00
  51/295

FOREIGN PATENT DOCUMENTS

| | | |
|---|---|---|
| JP | 2002-192407 A | 7/2002 |
| JP | 2008-142890 A | 6/2008 |
| WO | 2011/122553 A1 | 10/2011 |

OTHER PUBLICATIONS

International Search Report (Form PCT/ISA/210) dated Apr. 19, 2016, issued in PCT/JP2016/058785.
Written Opinion (Form PCT/ISA/237) dated Apr. 19, 2016, issued in PCT/JP2016/058785.

* cited by examiner

CUTTING INSERT, CUTTING TOOL, AND METHOD FOR MANUFACTURING MACHINED PRODUCT

TECHNICAL FIELD

The present disclosure relates to a cutting insert, a cutting tool, and a method for manufacturing a machined product, more specifically, relates to a cutting insert having a coating layer on the surface of the base member.

BACKGROUND ART

A cutting insert having a coating layer formed on the surface of a base member such as cemented carbide or cermet to improve wear resistance, slidability, and fracture resistance has been widely used as a cutting tool. It is also known to increase the strength of the cutting edge by forming the C chamfered surface (chamfer honing) and R honing at the cutting edge portion of the cutting insert.

Patent Literature 1 (JP 10-43912 A) discloses a cutting insert formed with a coating layer such as TiAlN layer on the surface of the cemented carbide substrate and formed with a chamfer on the cutting edge where the angle making up the rake face is 20° to 30° and the width as viewed from the rake face is from 0.015 to 0.05 mm.

SUMMARY OF INVENTION

In an embodiment, a cutting insert includes a base member having a coating layer on a part thereof. The cutting insert further includes first and second faces, a cutting edge, and a nose portion. The first face has-corner portions. The second face is adjacent to the first face. The cutting edge is located-on at least a part of a ridgeline portion between the first face and the second face. The nose portion is located— at the corner portion of the first face. The cutting edge includes—first and second cutting edges with the nose portion-therebetween. The first cutting edge is located on the coating layer and has a C chamfered surface with a first width of 5 μm to 30 μm in the front view of the first face and a chamfer angle of 35° to 50°.

A cutting tool of the present embodiment including a holder and the cutting insert mounted to an insert pocket provided to a tip of the holder.

A method for manufacturing a machined product of the present embodiment includes rotating the workpiece, bringing the cutting edge of the cutting tool into contact with the rotating workpiece, and separating the cutting tool from the workpiece.

DESCRIPTION OF EMBODIMENTS

A cutting insert 1 illustrated in FIGS. 1 to 5 (hereinafter, referred to as an insert 1) includes a first face and a second face adjacent to the first face. In the present embodiment, a first face 2 functions as a rake face and a second face 3 as a flank face, and hereinafter will be described as a rake face 2 and a flank face 3 respectively. In addition, at least a portion of the ridgeline portion between the rake face 2 and the flank face 3 functions as a cutting edge 4. The rake face 2 has a plurality of corner portions, and in the present embodiment, it has a substantially polygonal shape. A curved nose portion 5 is positioned at the corner portion of the rake face 2. The cutting edge 4 has a first cutting edge 4a and a second cutting edge 4b with the nose portion 5 interposed therebetween. In the present embodiment, the first cutting edge 4a functions as a front cutting edge and the second cutting edge 4b functions as a side cutting edge, and will be described as front cutting edge 4a and side cutting edge 4b in the following description. The flank face 3 has a front flank face 3a following the front cutting edge 4a and a side flank face 3b following the side cutting edge 4b. In the present embodiment, the boundary between the front cutting edge 4a and the side cutting edge 4b is defined as a point which is farthest from the center of the rake face 2 in the nose portion 5. A through hole 6 for inserting a screw is provided in the center portion of the rake face 2.

Figure 1:
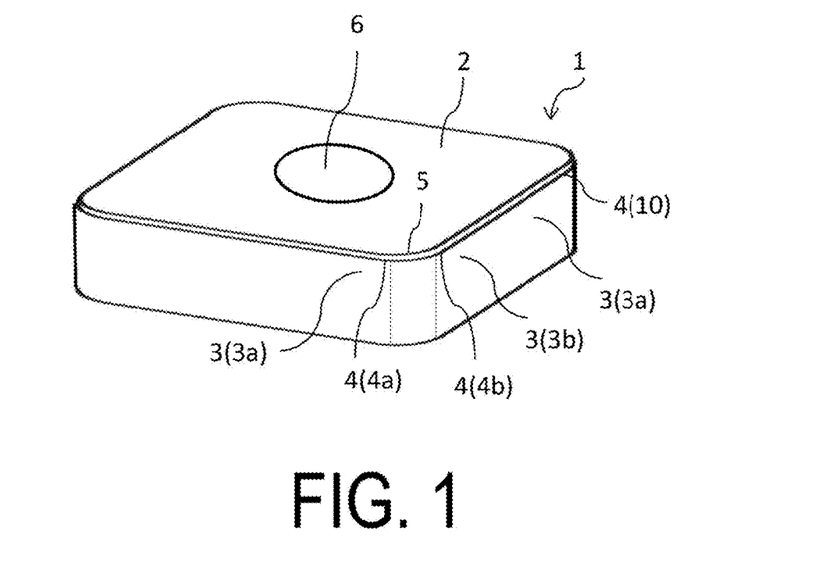
FIG. 1 is a schematic perspective view of an example of a cutting insert according to the present embodiment.
Figure 2:
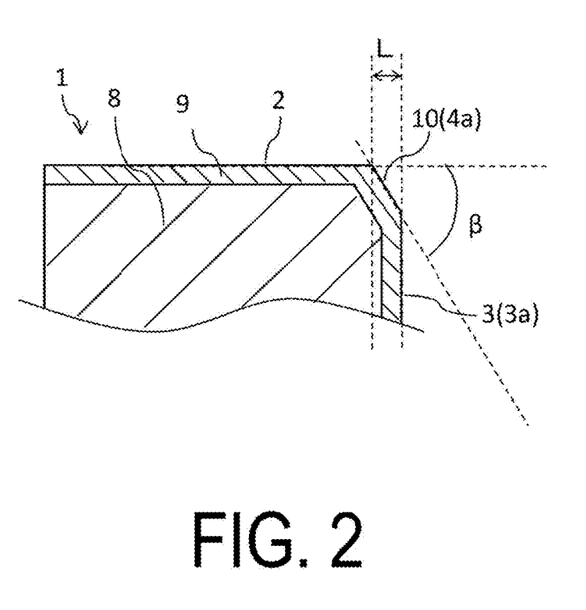
FIG. 2 is a partial cross-sectional view of the cutting insert illustrated in FIG. 1.

As illustrated in FIG. 2, the insert 1 includes a base member 8 and a coating layer 9 provided on the surface of the base member 8. At least the front cutting edge 4a is provided on the surface of the coating layer 9. Further, in the present embodiment, the coating layer 9 is not necessarily provided on the entire outer surface of the insert 1, but the surface of the base member 8 can also be the rake face 2 or the flank face 3.

Figure 7:
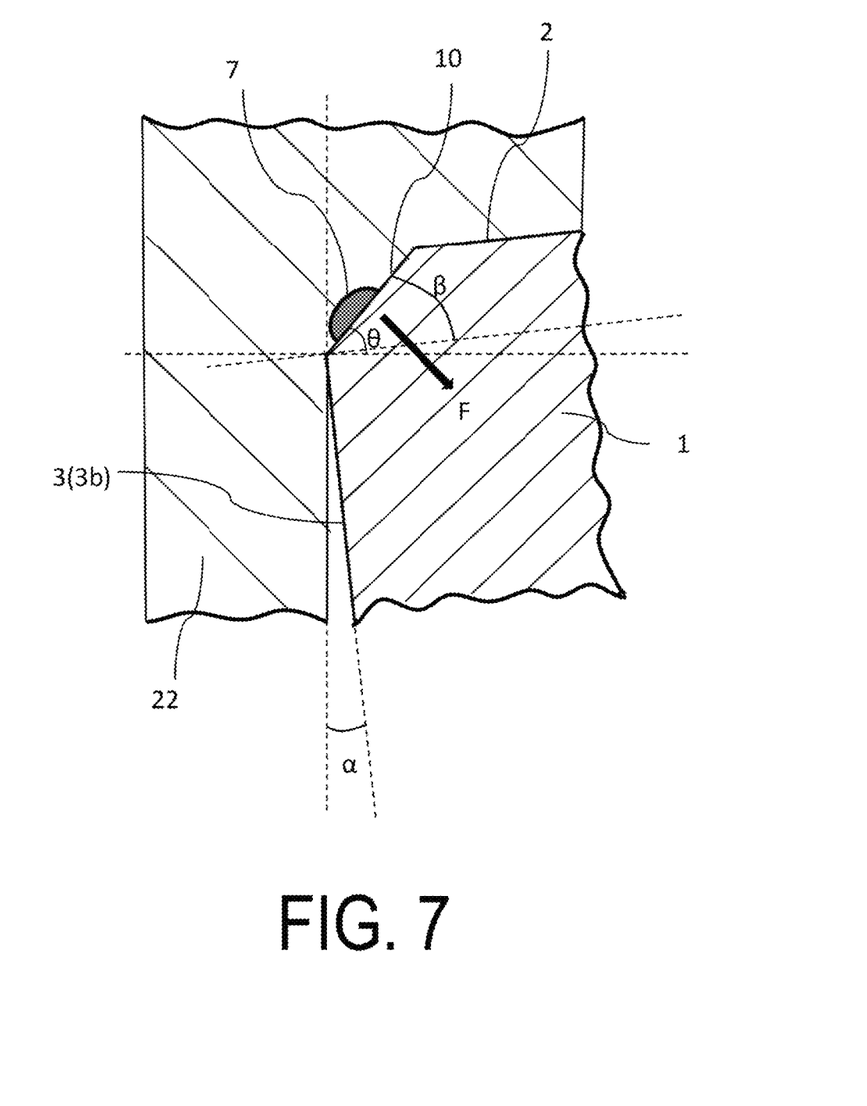
FIG. 7 is a schematic cross-sectional view of portion A in the step of bringing the cutting edge of the cutting tool into contact with workpiece in FIG. 6B.

As illustrated in FIG. 2, the front cutting edge 4a in the present embodiment is located on the coating layer 9 and has a C chamfered surface 10 between the rake face 2 and the flank face 3. The C chamfered surface 10 has a chamfer angle β of 35° to 50° and a first width L which is a C chamfered surface width in the front view of the rake face 2 is from 5 μm to 30 μm. As a result, as illustrated in FIG. 7, on the surface of the C chamfered surface 10, a welded object 7 which is generated when the insert 1 comes into contact with the workpiece is produced, and this welded object 7 acts as a protective membrane against wear of the coating layer 9. Therefore, wear of the coating layer 9 at the C chamfered surface 10 can be suppressed, thereby suppressing the wear resistance of the insert 1.

In order to explain the positional relationship between a workpiece 22 and the C chamfered surface 10, a method of cutting a workpiece using a cutting tool 20 with the insert 1 mounted thereon to manufacture a machined product is described with reference to FIGS. 6A to 6C.

Figure 6A:
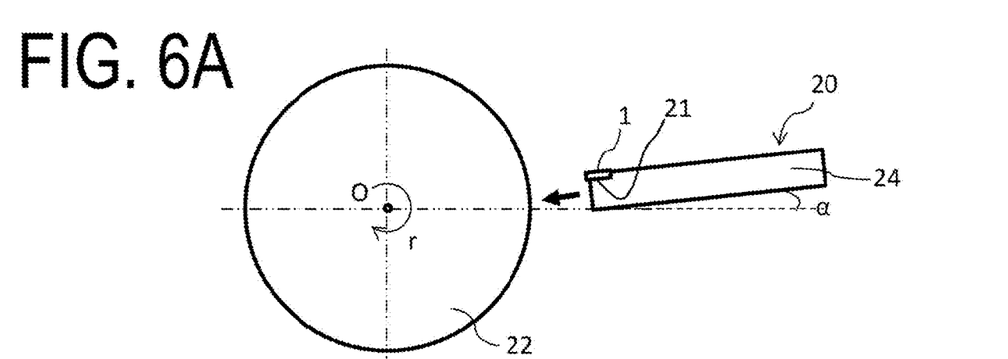
FIGS. 6A, 6B and 6C are diagrams for explaining a method for manufacturing a machined product according to the present embodiment, each being a schematic view illustrating one step of the manufacturing method.
Figure 6B:
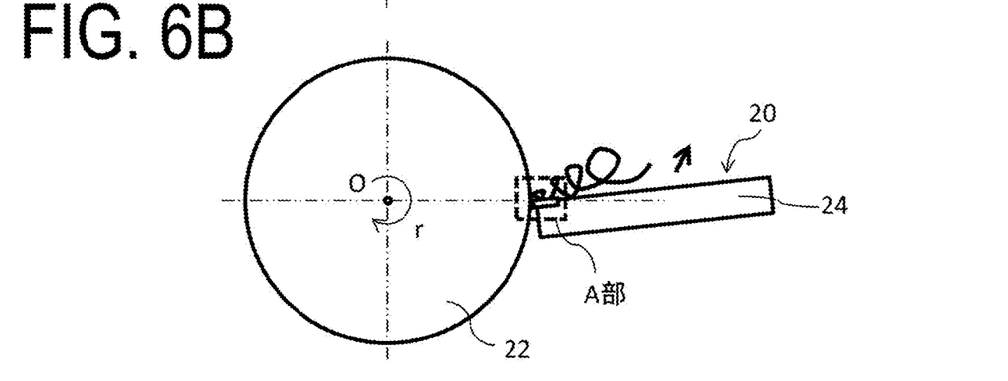
Figure 6C:
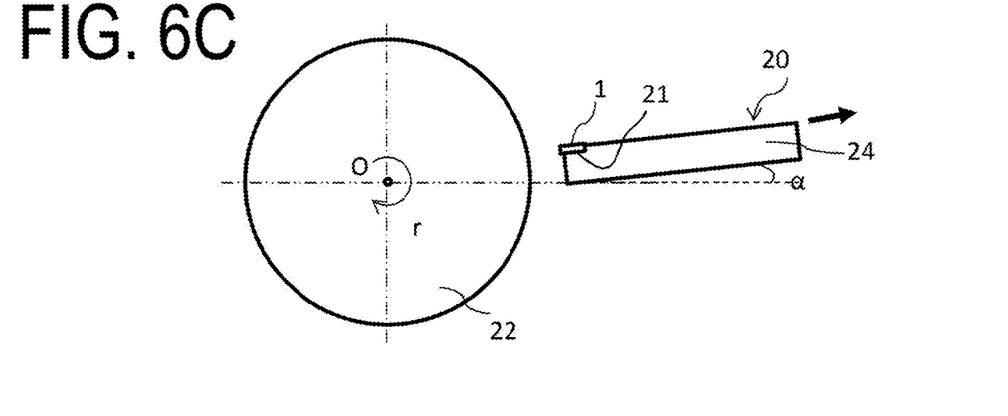

As illustrated in FIGS. 6A to 6C, in the cutting tool 20, an insert 1 is attached to an insert pocket 21 provided at a corner portion of a tip of a holder 24. The holder 24 has a substantially quadrangular prism shape and has an insert pocket 21 at a position opening to the side of the tip. The holder 24 is made of steel or hardened steel. The mounting surface (not illustrated) of the insert pocket 21 has a screw hole. In the cutting tool 20, the insert 1 is fitted into the insert pocket 21, a screw (not illustrated) is inserted from the rake face 2 side of the insert 1, and screws are screwed into the screw hole of the holder 24, whereby the insert 1 is attached.

The machined product is manufactured by (i) to (iii).

(i) Disposing the cutting tool 20 above the workpiece 22 (FIG. 7A). Rotating the workpiece in the arrow r direction about a rotation axis O, and bringing the cutting tool 20 close to the workpiece 22 (FIG. 6A). Here, since it is sufficient for the workpiece 22 and the cutting tool 20 to approach each other relatively, the workpiece 22 may be brought close to the fixed cutting tool 20.

(ii) Bringing the cutting tool 20 closer to the workpiece 22, thereby causing the cutting edge 4 of the cutting tool 20 to come into contact with the surface of the rotating workpiece 22 at a predetermined position, and cutting the workpiece 22 (FIG. 6B). In the cutting process, the cutting tool 20 is first brought into contact with the insert 1 attached to the cutting tool 20 from the direction perpendicular to the side surface of the workpiece. At that time, the workpiece can be machined by sliding the cutting tool 20 in parallel with the rotation axis of the workpiece 22. This is the so-called turning process. The cutting tool 20 is brought into contact with the workpiece 22 in a state of being inclined to the specified side rake angle α.

(iii) The cutting tool 20 is separated from the workpiece 22 (FIG. 6C).

Next, description will be made with reference to a schematic sectional view of a portion A in FIG. 6B of FIG. 7. The contact angle θ with the workpiece 22 of the C chamfered surface 10 is obtained from the inclination from the direction perpendicular to the finished surface of the workpiece 22, but as illustrated in the schematic view of FIG. 7, the contact angle θ with the workpiece 22 of the C chamfered surface 10 is an angle α+β, which is the sum of the side rake angle α of the holder 24 and the chamfer angle β of the C chamfered surface 10. The force that the C chamfered surface 10 receives from the workpiece 22 is a resultant force F of a feed component force and a main component force. As the difference between the angle (90°−θ) orthogonal to the C chamfered surface 10 and the angle of the resultant force F becomes smaller, the protective film of the welded object 7 is more likely to be formed, and the workpiece 22 of the C chamfered surface 10 has a contact angle θ of 40° to 55°. In the present embodiment, the chamfer angle β is 35° to 50°, and the side rake angle α is generally −5° to −6°, so the angle (90°−θ) orthogonal to the C chamfered surface 10 is 40° to 56°. Thus, in the insert 1 of the present embodiment, the angle between the angle (90°−θ) orthogonal to the C chamfered surface 10 and the direction of the resultant force F is zero or close to zero. Therefore, cutting is performed in a form where the welded object 7 is present on the C chamfered surface 10, and wear of the coating layer 9 present on the C chamfered surface 10 is suppressed.

That is, if the chamfer angle β is less than 35° or the chamfer angle β is greater than 50°, the welded object 7 is difficult to generate and the wear of the coating layer 9 is likely to proceed. The chamfer angle β is an angle formed by the C chamfered surface 10 with respect to a ground contact surface (not illustrated) when the insert 1 is placed on the holder 24.

Also, if the first width L is less than 5 μm, the welded object 7 is difficult to generate and the cutting edge 4 is prone to be chipped. Conversely, if the first width L is greater than 30 μm, the cutting resistance increases and the wear progresses faster.

Further, in the present embodiment, the second width in the front view of the rake face 2, which is the width of the C chamfered surface of the side cutting edge 4b (hereinafter referred to as the second C chamfered surface for identification) may be narrower than the first width of the front cutting edge 4a. Note that even if a sharp edge where the second C chamfered surface is not formed or the second C chamfered surface is formed, the side cutting edge 4b whose second width is narrower than the first width of the front cutting edge 4a is narrower than the first width. When such a configuration is satisfied, adhesion of the welded object 7 does not occur or is difficult to occur at the side cutting edge 4b, whereby the sharpness is improved and the finished surface of the workpiece 22 can be made smooth and free from clogging. Even when the side cutting edge 4b is positioned on the coating layer 9, adhesion of the welded object 7 does not occur or is difficult to occur at the side cutting edge 4b, whereby the sharpness is improved and the finished surface of the workpiece 22 can be made smooth and free from clogging when such a configuration is satisfied.

Figures 4A, 4B, 4C:
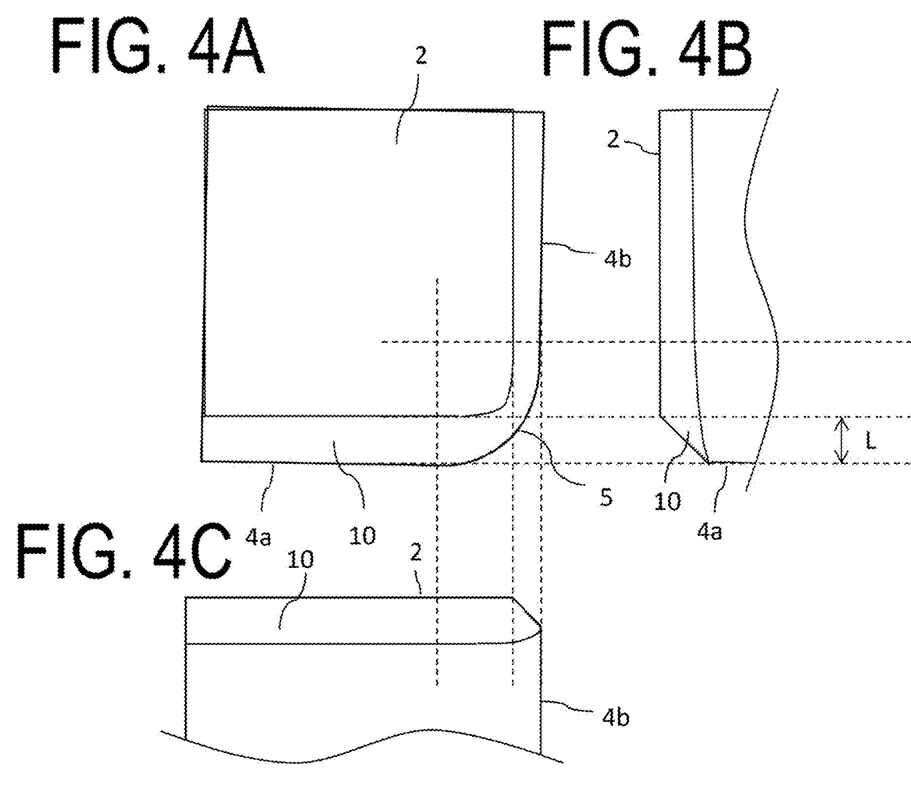
FIG. 4A is an enlarged view of a main portion of another example of the cutting insert of the present embodiment.
FIG. 4B is a side view of the cutting insert of FIG. 4A on the cross cutting edge side.
FIG. 4C is a side view of the front cutting edge side of the cutting insert of FIG. 4A.
Figures 5A, 5B, 5C:
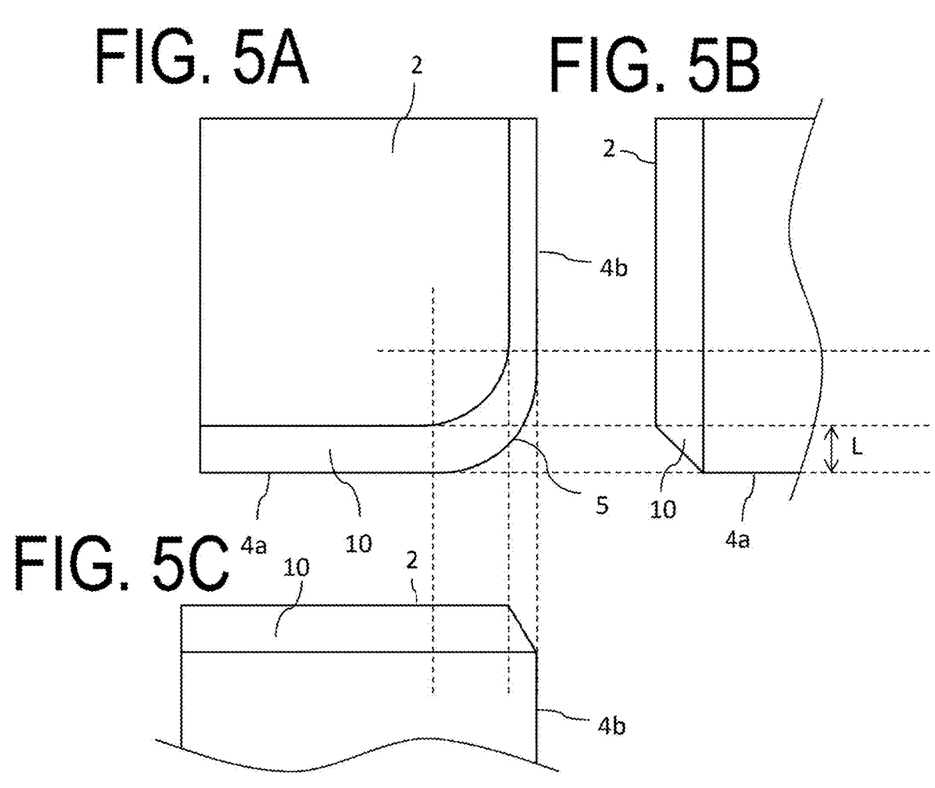
FIG. 5A is an enlarged view of a main portion of another example of the cutting insert of the present embodiment.
FIG. 5B is a side view of the cutting insert of FIG. 5A on the cross cutting edge side.
FIG. 5C is a side view of the front cutting edge side of the cutting insert of FIG. 5A.

As a method of changing the first width of the front cutting edge 4a and the second width of the side cutting edge 4b, the chamfer angle of the front cutting edge 4a and the side cutting edge 4b are the same but the depth is changed as illustrated in FIGS. 4A to 4C or the chamfer angle is changed as illustrated in FIGS. 5A to 5C.

Figure 3A:
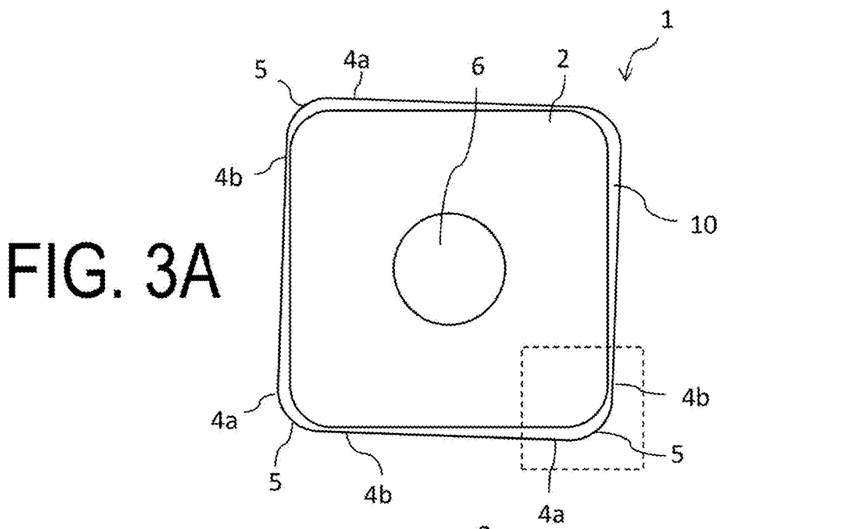
FIG. 3A is a top view of the cutting insert of FIG. 1.
Figure 3B:
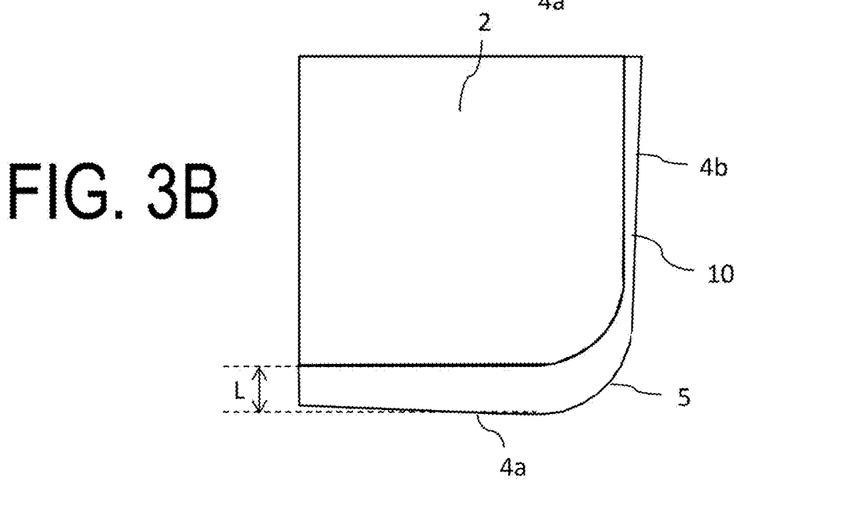
FIG. 3B is an enlarged view of a main portion of FIG. 3A.

Further, in the front view of the rake face 2, the width of the cutting edge 4 may be gradually narrowed from the front cutting edge 4a via the nose portion 5 toward the side cutting edge 4b. This gradually narrowing state is configured as illustrated in FIG. 3B. When such a configuration is satisfied, good wear resistance and a good finished surface can be obtained. In the side cutting edge 4b, it is preferable not to provide the second C chamfered surface, and where the width viewed from the rake face is 5 μm or less, in particular, the finished surface of the workpiece 22 can be made smooth and free of fogging.

If the arithmetic average roughness of the flank face 3 is smaller than the arithmetic average roughness of the rake face 2, the amount of the welded object 7 to be generated on the C chamfered surface 10 becomes the appropriate amount and the finished surface of the workpiece 22 can be made smooth. When the arithmetic average roughness on the flank face 3 is from 0.01 to 0.1 μm, the finished surface of the workpiece 22 can be smoothed. When the arithmetic average roughness on the rake face 2 is from 0.02 to 0.5 μm, the amount of the welded object 7 to be generated becomes an appropriate amount.

Further, the arithmetic average roughness of the rake face 2 and the flank face 3 can be adjusted by polishing the surface of the coating layer 9 after forming the coating layer 9 on the base member 8. Blasting or brushing is preferred in the polishing process. When blasting is adopted, it is possible to control the arithmetic average roughness in the rake face 2 and the flank face 3 by adjusting the position and direction of the nozzle for discharging the abrasive grains.

The cutting conditions suitable for the cutting tool 20 of the present embodiment include the cutting speed being from 50 m/min to 250 mm/min, cutting depth being from 0.05 mm to 3.0 mm, and feed being from 0.05 mm/rev to 0.4 mm/rev. Under this condition, the welded object 7 is likely to be formed on the C chamfered surface 10 during the cutting process.

In particular, when the workpiece 22 is low carbon steel or aluminum alloy steel, formation of the welded object 7 is likely to occur, and the wear resistance of the coating layer 9 is improved.

When the coating layer contains at least one of TiC, TiN, TiCN, $Al_2O_3$, TiMN (where M is at least one type selected from metals in group 4, 5, and 6 of the periodic table, excluding Ti, Al, and Si) and diamond-like carbon layer, the surface of the coating layer 9 is smooth and the formation of the welded object 7 tends to occur. In particular, when the outermost surface of the coating layer 9 is made of TiN or TiMN, formation of a welded object is likely to occur and the wear resistance of the coating layer 9 is improved. The coating layer 9 may be a single layer or a multi-layer of two or more layers.

On the other hand, the base member 8 may be a Ti-based cermet or a cemented carbide alloy in which a hard phase made from tungsten carbide (WC) and, as desired, at least one type selected from the group consisting of carbides, nitrides, and carbonitrides of a metal of group 4, 5, or 6 of the periodic table is bonded with a bonding phase made from an iron group metal such as cobalt (Co) or nickel (Ni), or it may be a ceramic such as $Si_3N_4$, $Al_2O_3$, diamond, or cubic boron nitride (cBN). From the perspectives of fracture resistance and wear resistance, the base member 8 is preferably made from cemented carbide alloy or cermet. Depending on the application, the base member 8 may be made from a metal such as carbon steel, high-speed steel, or alloy steel.

In order to manufacture the insert 1 of the present embodiment, first, a predetermined mixed powder is molded and fired to prepare a sintered body. After polishing, such as double-head machining or outer peripheral machining is applied to the surface of the sintered body as desired, C chamfered surface machining is applied to the ridgeline portion. A specific method of C chamfered surface machining is machining with a diamond grindstone and the like.

Then, the coating layer 9 is formed on the surface of the base member 8 obtained by a physical vapor deposition (PVD) method or a chemical vapor deposition (CVD) method. Further, by polishing the surface of the coating layer 9 corresponding to the C chamfered surface 10 so that the C chamfered surface 10 is a smooth surface capable of promoting the formation of the protective film of the welded object 7, the cutting insert is further excellent in wear resistance.

EXAMPLES

A metal cobalt (Co) powder having an average particle diameter of 1.2 μm was added and mixed at a ratio of 6 mass % to tungsten carbide (WC) powder having an average particle diameter of 1.5 μm and by press molding, the shape of cutting insert (SNGN 120408) is formed. The obtained molded body was subjected to debindering treatment and fired in a vacuum of 0.5 to 100 Pa at 1400° C. for 1 hour to prepare cemented carbide. Further, the prepared cemented carbide was processed with a diamond grindstone.

Next, on the cemented carbide, a TiAlN layer having a thickness of 4 μm at the C chamfered surface portion was formed by a PVD method. Cutting inserts, samples Nos. 1 to 14, were prepared. For each sample, the chamfer angle on the C chamfered surface of the front cutting edge, the width of the C chamfered surface in the front view of the rake face, the chamfer angle on the second C chamfered surface of the side cutting edge, the width of the second C chamfered surface in the front view of the rake face and the arithmetic average roughness on the rake face and flank face were measured.

Next, the obtained insert was mounted on a holder having a side rake angle α of 6° and cutting testing was performed under the following cutting conditions in the machining process in FIG. 2. Results are shown in Table 1.

Cutting method: External turning machining
Workpiece: SCM 435
Cutting speed: 200 m/min
Feed rate: 0.2 mm/rev
Cut: 1.5 mm
Cutting state: Wet type (with coolant)
Evaluation method: Cutting distance up to 0.1 mm of flank wear (km)

TABLE 1

| Sample No. | Front cutting edge | | Side cutting edge | | Ra (μm) | | Cutting Performance | | |
|---|---|---|---|---|---|---|---|---|---|
| | β (°) | L (μm) | β (°) | L (μm) | Rake face | Flank face | Cutting distance (km) | Front cutting state | Machined surface roughness[1] |
| 1 | 35 | 15 | 35 | 15 | 0.14 | 0.08 | 5.000 | Welded | ○ |
| 2 | 40 | 15 | 40 | 15 | 0.10 | 0.09 | 5.400 | Welded | ○ |
| 3 | 45 | 15 | 45 | 15 | 0.17 | 0.07 | 5.500 | Welded | ○ |
| 4 | 50 | 15 | 50 | 15 | 0.11 | 0.10 | 5.000 | Welded | ○ |
| 5 | 55 | 15 | 55 | 15 | 0.05 | 0.15 | 4.000 | No welding | X |
| 6 | 45 | 3 | 45 | 3 | 0.10 | 0.04 | 4.200 | Presence of Chipping | ◎ |
| 7 | 45 | 20 | 45 | 5 | 0.12 | 0.03 | 5.500 | Welded | ◎ |
| 8 | 45 | 5 | 45 | 10 | 0.15 | 0.09 | 5.400 | Welded | ○ |
| 9 | 45 | 15 | 45 | 15 | 0.13 | 0.08 | 5.500 | Welded | ○ |
| 10 | 45 | 30 | 45 | 30 | 0.13 | 0.13 | 5.400 | Welded | Δ |
| 11 | 45 | 40 | 45 | 30 | 0.24 | 0.18 | 4.000 | Large Wear | X |
| 12 | 45 | 15 | 45 | 3 | 0.08 | 0.01 | 5.500 | Welded | ◎ |

TABLE 1-continued

|  | Front cutting edge | | Side cutting edge | | Ra (μm) | | Cutting Performance | | |
| --- | --- | --- | --- | --- | --- | --- | --- | --- | --- |
|  |  |  |  |  | Rake | Flank | Cutting distance | Front cutting | Machined surface |
| Sample No. | β (°) | L (μm) | β (°) | L (μm) | face | face | (km) | state | roughness[1] |
| 13 | 30 | 15 | 30 | 15 | 0.10 | 0.14 | 4.000 | No welding | Δ |
| 14 | 45 | 20 | 45 | 5 | 0.03 | 0.03 | 5.000 | Slight welding | ⊚ |

[1]Roughness of machined surface:
⊚ very good,
○ good,
Δ slightly bad,
X poor

From the results shown in Table 1, Sample No. 5 had a chamfer angle of greater than 50°, Sample No. 13 had a chamfer angle of less than 35°, and in each case, there was no generation of welded objects on the C chamfered surface, and the cutting distance did not extend. Also, the width of the C chamfered surface viewed from the rake face side was less than 5 μm in Sample No. 6, whereby chipping occurred in the cutting edge and the cutting distance became shorter. Since the width of the C chamfered surface viewed from the rake face side is greater than 30 μm in Sample No. 11, the cutting resistance increases, the flank face wear becomes significant, and the cutting distance becomes short.

On the contrary, it was confirmed the cutting distance increased for Sample Nos. 1 to 4, 7 to 10, 12, and 14 having a chamfer angle of 35° to 50° and a width of 5 μm to 30 μm viewed from the side of the rake face. Particularly, the machined surface roughness was also good in Sample Nos. 7 and 12 in which the first width at the front cutting edge is wider than the second width at the side cutting edge. In both Sample Nos. 7 and 12, the C chamfered surface width gradually narrowed from the front cutting edge through the nose portion toward the side cutting edge.

In addition, in Sample Nos. 1 to 4, 7 to 9, and 12 where the arithmetic average roughness on the flank face was smaller than the arithmetic average roughness on the rake face and the arithmetic average roughness on the flank face was from 0.01 to 0.1 μm, the amount of welded objects generated on the front cutting edge was appropriate, the cutting distance was long, and the machined surface roughness was also good.

REFERENCE SIGNS LIST

1 Insert (cutting insert)
2 Rake face
3 Flank face
　3a Front flank face
　3b Side flank face
4 Cutting edge
　4a Front cutting edge
　4b Side cutting edge
5 Nose portion
6 Through hole
7 Welded object
8 Base member
9 Coating layer
10 C chamfered surface
20 Cutting tool
21 Insert pocket
22 Workpiece
24 Holder
α Side rake angle
β Chamfer angle
θ Contact angle with the workpiece
L First width (C chamfered surface width in front view of rake face)

What is claimed is:

1. A cutting insert, comprising:
  a base member including a coating layer on at least a part thereof;
  a first face comprising a plurality of corner portions;
  a second face adjacent to the first face;
  a cutting edge located on at least a part of a ridgeline portion between the first face and the second face, and comprising:
    a first cutting edge on the coating layer, having a C chamfered surface with a first width of 5 μm to 30 μm in the front view of the first face and a chamfer angle of 35° to 50°; and
    a second cutting edge; and
  a nose portion located at the corner portions of the first face between the first cutting edge and the second cutting edge,
  wherein the second cutting edge has a second width narrower than the first width in the front view of the first face.

2. The cutting insert according to claim 1, wherein a width of the cutting edge in a front view of the first face gradually narrows from the first cutting edge toward the second cutting edge.

3. The cutting insert according to claim 1, wherein an arithmetic average roughness on the second face is smaller than an arithmetic average roughness on the first face.

4. The cutting insert according to claim 3, wherein the arithmetic average roughness on the second face is from 0.01 to 0.1 μm.

5. The cutting insert according to claim 3, wherein the arithmetic average roughness on the first face is from 0.02 to 0.5 μm.

6. The cutting insert according to claim 1, wherein the coating layer comprises any one of a TiN layer, a TiMN layer and a diamond-like carbon layer; wherein M is selected from the group consisting of: metals in group 4, 5, and 6 of the periodic table, and combinations thereof; excluding Ti, Al, and Si.

7. A cutting tool comprising:
  a holder comprising an insert pocket at a tip thereof; and
  the cutting insert according to claim 1 in the insert pocket.

8. A cutting insert, comprising:
a base member including a coating layer on at least a part thereof;
a first face comprising a plurality of corner portions;
a second face adjacent to the first face;
a cutting edge located on at least a part of a ridgeline portion between the first face and the second face, and comprising:
  a first cutting edge on the coating layer, having a C chamfered surface with a first width of 5 µm to 30 µm in the front view of the first face and a chamfer angle of 35° to 50°; and
  a second cutting edge; and
a nose portion located at the corner portions of the first face between the first cutting edge and the second cutting edge,
wherein a width of the cutting edge in a front view of the first face gradually narrows from the first cutting edge toward the second cutting edge.

9. The cutting insert according to claim 8, wherein an arithmetic average roughness on the second face is smaller than an arithmetic average roughness on the first face.

10. The cutting insert according to claim 9, wherein the arithmetic average roughness on the second face is from 0.01 to 0.1 µm.

11. The cutting insert according to claim 9, wherein the arithmetic average roughness on the first face is from 0.02 to 0.5 µm.

12. The cutting insert according to claim 8, wherein the coating layer comprises any one of a TiN layer, a TiMN layer and a diamond-like carbon layer; wherein M is selected from the group consisting of: metals in group 4, 5, and 6 of the periodic table, and combinations thereof; excluding Ti, Al, and Si.

13. A cutting tool comprising:
a holder comprising an insert pocket at a tip thereof; and
the cutting insert according to claim 8 in the insert pocket.

14. A cutting insert, comprising:
a base member including a coating layer on at least a part thereof;
a first face comprising a plurality of corner portions;
a second face adjacent to the first face;
a cutting edge located on at least a part of a ridgeline portion between the first face and the second face, and comprising:
  a first cutting edge on the coating layer, having a C chamfered surface with a first width of 5 µm to 30 µm in the front view of the first face and a chamfer angle of 35° to 50°; and
  a second cutting edge; and
a nose portion located at the corner portions of the first face between the first cutting edge and the second cutting edge,
wherein an arithmetic average roughness on the second face is smaller than an arithmetic average roughness on the first face.

15. The cutting insert according to claim 14, wherein the arithmetic average roughness on the second face is from 0.01 to 0.1 µm.

16. The cutting insert according to claim 14, wherein the arithmetic average roughness on the first face is from 0.02 to 0.5 µm.

17. The cutting insert according to claim 8, wherein the coating layer comprises any one of a TiN layer, a TiMN layer and a diamond-like carbon layer; wherein M is selected from the group consisting of: metals in group 4, 5, and 6 of the periodic table, and combinations thereof; excluding Ti, Al, and Si.

18. A cutting tool comprising:
a holder comprising an insert pocket at a tip thereof; and
the cutting insert according to claim 14 in the insert pocket.

* * * * *